United States Patent
Rojo et al.

(10) Patent No.: US 7,087,112 B1
(45) Date of Patent: Aug. 8, 2006

(54) NITRIDE CERAMICS TO MOUNT ALUMINUM NITRIDE SEED FOR SUBLIMATION GROWTH

(75) Inventors: Juan Carlos Rojo, Sound Beach, NY (US); Leo J. Schowalter, Latham, NY (US); Kenneth Morgan, Castleton, NY (US); Jan Barani, Schenectady, NY (US)

(73) Assignee: Crystal IS, Inc., Green Island, NY (US)

( * ) Notice: Subject to any disclaimer, the term of this patent is extended or adjusted under 35 U.S.C. 154(b) by 434 days.

(21) Appl. No.: 10/725,869

(22) Filed: Dec. 2, 2003

(51) Int. Cl.
*C30B 29/38* (2006.01)

(52) U.S. Cl. .................... 117/77; 117/73; 117/109; 117/952; 501/86; 501/92; 501/98.4

(58) Field of Classification Search ............... 117/73, 117/74, 77, 109, 952; 501/86, 92, 98.4
See application file for complete search history.

(56) References Cited

U.S. PATENT DOCUMENTS 5,924,874 A * 7/1999 Gotoh et al. ............... 439/73
6,048,813 A * 4/2000 Hunter ......................... 501/86
6,066,205 A * 5/2000 Hunter ....................... 117/200

FOREIGN PATENT DOCUMENTS

JP 61-236686 * 10/1986

OTHER PUBLICATIONS

G.A. Slack and T.F. McNelly. J. Cryst. Growth 34 (1976) 263.
G.A. Slack and T.F. McNelly. J. Cryst. Growth 42 (1977) 560.
J.C. Rojo, L.J. Schowalter, R. Gaska, M. Shur, M.A. Khan, J. Yang, and D.D. Koleskie. Journal of Crystal Growth 240 (2002) 508.
C.M. Balkas, Z. Sitar, T. Zheleva, L. Bergman, R. Nemanchi, R.F. Davis. J. Crystal Growth 179(1997)363.
L. Liu, D. Zhuang, B. Liu, Y. Shi, J.H. Edgar, S. Rajasingam, M. Kuball. Physica Status Solidi A 188(2001) 769.
R. Schlesser, R. Dalmau, Z. Sitar. Journal of Crystal Growth 243(2002)416.

* cited by examiner

*Primary Examiner*—Robert Kunemund
(74) *Attorney, Agent, or Firm*—Goodwin Procter LLP

(57) ABSTRACT

An apparatus and method for fabricating a mount for an aluminum nitride (AlN) seed for single crystal aluminum nitride growth is provided. A holder having a proximal base and wall portions extending therefrom is fabricated from crystal growth crucible material, and defines an internal cavity. An AlN seed is placed within the holder, and placed within a nitrogen atmosphere at a temperature at or exceeding the melting point of a suitable material capable of forming a nitride ceramic by nitridation, such as aluminum. Pellets fabricated from this material are dropped into the holder and onto the seed, so that they melt and react with the nitrogen atmosphere to form a nitride ceramic. The seed is effectively molded in-situ with the ceramic, so that the ceramic and holder forms a closely conforming holder for the seed, suitable for single crystal AlN growth.

20 Claims, 1 Drawing Sheet

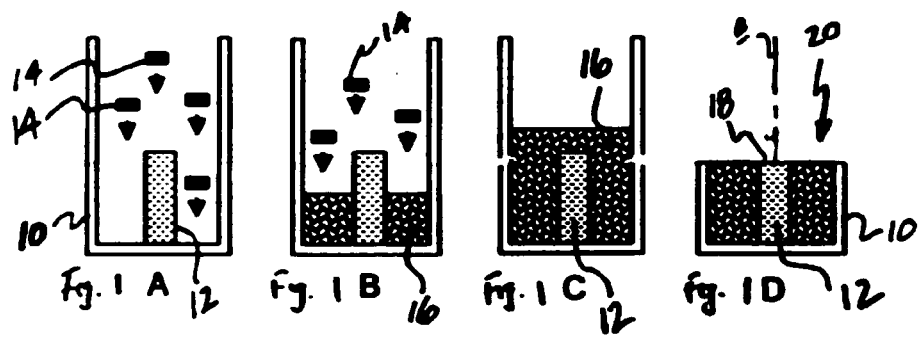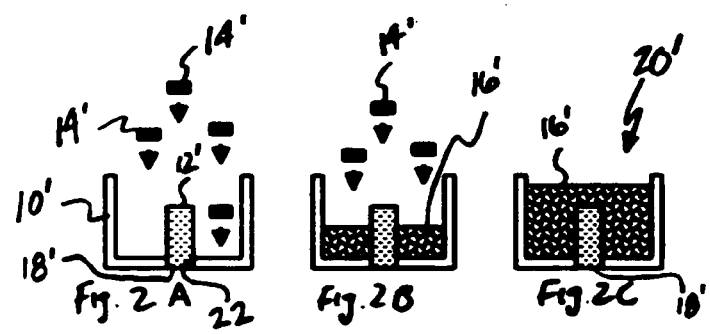

NITRIDE CERAMICS TO MOUNT ALUMINUM NITRIDE SEED FOR SUBLIMATION GROWTH

GOVERNMENT SPONSORSHIP

Part of the work leading to this invention was made under a United States Government SBIR Contract F33615-00-C-5425. The U.S. Government may have certain rights in this invention.

RELATED APPLICATIONS

This application is related to U.S. patent application Ser. No. 10/324,998, filed on Dec. 20, 2002, entitled Method and Apparatus for Producing Large, Single-Crystals of Aluminum Nitride, which is fully incorporated herein by reference.

BACKGROUND

1. Technical Field

The present invention relates to seeded growth of single-crystal Aluminum Nitride (AlN), and more particularly, to an apparatus and method for mounting AlN seeds for relatively large, single-crystal AlN growth by sublimation-recondensation.

2. Background Information

The growth of AlN single crystals using the sublimation-recondensation technique, first developed by Slack and McNelly (G. A. Slack and T. F. McNelly, J. Cryst. Growth 34 (1976) 263; and G. A. Slack and T. F. McNelly, J. Cryst. Growth 42 (1977) 560) is currently recognized as a most promising method to produce large bulk AlN single crystals to be used as substrates for the device (e.g., semiconductor) fabrication industry. In this method, a thermal gradient drives the sublimation of a polycrystalline or powder ceramic AlN starting material and subsequent recondensation at a colder portion of a crucible as a single crystal. Large crystals of AlN exceeding 1 cm in diameter have been grown using this sublimation technique (J. C. Rojo, L. J. Schowalter, R. Gaska, M. Shur, M. A. Khan, J. Yang, and D. D. Koleske, Journal of Crystal Growth 240 (2001) 508). These boules were grown without using a seed. Rather, growth was effected by spontaneous nucleation on the walls of the crucible.

Several seeded crystal growth efforts have been attempted using Silicon Carbide (SiC). See, for example, C. M. Balkas, Z. Sitar, T. Zheleva, L. Bergman, R. Nemanich, R. F. Davis, J. Crystal Growth (1997) 363; L. Liu, D. Zhuang, B. Liu, Y. Shi, J. H. Edgar, S. Rajasingam, M. Kuball, Physica Status Solidi A 188 (2001) 769. Attempts at effecting seeded growth using AlN have been described by R. Schlesser, R. Dalmau, Z. Sitar, in the Journal of Crystal Growth 243 (2002) 216–420. However, to date there have been no reports of successful seeded growth of large AlN boules. Thus, a need exists for a method and apparatus capable of providing seeded growth of large (e.g., greater than 1 cm diameter) AlN boules.

SUMMARY

In one aspect, the present invention includes a method for fabricating a mount for an aluminum nitride (AlN) seed used for single crystal aluminum nitride growth. The method includes providing a holder having a proximal base and wall portions extending therefrom to define a cavity, the holder being fabricated from at least one the materials: BN (boron nitride), pBN (pyrolitic boron nitride), W (tungsten), Re (rhenium), graphite, Ta (tantalum), TaN (tantalum nitride), or combinations thereof. The method also includes placing an AlN seed within the cavity of the holder, providing aluminum pellets, and placing the holder and seed within a nitrogen atmosphere at a temperature above the melting point of the pellets. The pellets are then dropped into the holder and onto the seed, and the pellets are permitted to melt and react with the nitrogen atmosphere to form a nitride ceramic, so that the nitride ceramic is formed in conforming surface to surface engagement with the seed. These steps are continued until the seed is substantially buried inside the ceramic. A distal portion of the holder, ceramic, and seed, is cut off, so that the proximal end of the holder includes a proximal portion of the seed embedded within the ceramic, with the seed having an exposed crystal growth surface co-planar with a surface of the ceramic.

Another aspect of the invention includes a method for fabricating a mount for an aluminum nitride (AlN) seed for single crystal aluminum nitride growth. The method includes providing a holder sized and shaped to receive an AlN seed therein, the holder fabricated from crystal growth crucible material; placing an AlN seed within the holder; and encapsulating the AlN seed within the holder with at least one of the crystal growth crucible material and a ceramic so that the only surface of the seed crystal that is exposed is a growth surface of the seed.

A further aspect of the invention includes a combination mount and aluminum nitride (AlN) seed for single crystal aluminum nitride growth. The combination includes a holder fabricated from crystal growth crucible material; a nitride ceramic disposed within the holder; and an AlN seed embedded in conforming surface to surface engagement within the nitride ceramic. The nitride ceramic extends 360 degrees about the AlN seed in embedded engagement therewith. The nitride ceramic is located in conforming surface to surface engagement with the holder; and a crystal growth surface of the AlN seed extends free of the nitride ceramic.

A still further aspect of the invention includes a method for effecting seeded single crystal aluminum nitride (AlN) growth. The method includes providing a holder having a proximal base and wall portions extending therefrom to define a cavity, the holder fabricated from crystal growth crucible material; disposing an AlN seed within the holder; and providing pellets of a material capable of forming a nitride ceramic by nitridation. The method further includes placing the holder and seed within a nitrogen atmosphere at a temperature above the melting point of the pellets; dropping the pellets into the holder and onto the seed; and permitting the pellets to melt and react with the nitrogen atmosphere to form a nitride ceramic, so that the nitride ceramic is formed in conforming surface to surface engagement with the seed. The holder with the ceramic and embedded seed is then placed within a crystal growth enclosure containing Al and $N_2$ vapor. An exposed surface of the seed is cooled relative to other locations in the crystal growth enclosure; and the vapor is deposited under conditions capable of growing single crystalline AlN originating at the exposed surface.

A yet further aspect of the invention includes a method for effecting seeded single crystal aluminum nitride (AlN) growth. The method includes providing a holder having a proximal base and wall portions extending therefrom to define a cavity, the holder being fabricated from a material selected from the group consisting of BN (boron nitride), pBN (pyrolitic boron nitride), W (tungsten), Re (rhenium), graphite, Ta (tantalum), TaN (tantalum nitride), and combinations thereof. The method also includes placing an AlN seed within the cavity of the holder; providing aluminum pellets; placing the holder and seed within a nitrogen atmosphere at a temperature above the melting point of the pellets; and dropping the aluminum pellets into the holder and onto the seed; so that the pellets to melt and react with the nitrogen atmosphere to form a nitride ceramic in conforming surface to surface engagement with the seed. Additional pellets may be dropped until the seed is substantially buried inside the ceramic. A distal portion of the holder, ceramic, and seed is cut off so that the proximal end of the holder includes a proximal portion of the seed embedded within the ceramic, with the seed having an exposed crystal growth surface co-planar with a surface of the ceramic. The holder with the ceramic and embedded seed is then placed within a crystal growth enclosure containing Al and $N_2$ vapor; the exposed crystal growth surface is cooled relative to other locations in the crystal growth enclosure; and the vapor is deposited under conditions capable of growing single crystalline AlN originating at the crystal growth surface.

BRIEF DESCRIPTION OF THE DRAWINGS

The above and other features and advantages of this invention will be more readily apparent from a reading of the following detailed description of various aspects of the invention taken in conjunction with the accompanying drawings, in which:

FIGS. 1A–1D are schematic, elevational cross-sectional representations of various steps relating to one embodiment of the present invention; and FIGS. 2A–2C are views similar to those of FIGS. 1A–1D of various steps relating to an alternate embodiment of the present invention.

DETAILED DESCRIPTION

In the following detailed description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the present invention. The following detailed description is, therefore, not to be taken in a limiting sense, and the scope of the present invention is defined by the appended claims and their equivalents. For clarity of exposition, like features shown in the accompanying drawings are indicated with like reference numerals and similar features as shown in alternate embodiments in the drawings are indicated with similar reference numerals.

Embodiments of the present invention effectively use a seed oriented along a specific crystallographic axis as a template to grow large AlN boules. These embodiments effectively address problems associated with the spontaneous nature of the nucleation process during self-seeded (seedless) growth.

One of the difficulties associated with the use of seeds during crystal growth from the vapor phase is the development of a suitable approach for holding the seed within the crucible. While, as discussed above, thermal gradients are used in the crucible to affect the growth, it has been observed that the presence of thermal gradients in proximity to an AlN seed may potentially cause a partial or total sublimation of the seed even before the growth starts. For example, the presence of even a relatively small gap around the periphery of a seed, e.g., between the seed and seed holder, may result in a temperature gradient across the gap. In the event the higher temperature of this gradient is located at the seed, the seed may evaporate and eventually preclude the growth (or continuation of growth) of a single crystal. Thus, embodiments of the present invention include a recognition of the surprisingly dramatic effect that this phenomenon appears to have in AlN and, especially, the damaging effect of such gap-induced gradients on the crystalline quality of AlN.

It has been found that even though seed holders may be machined to tightly fit the seed, any gap between the seed surface and the holder may potentially lead to the destruction of the seed if the gradient across that gap is sufficient to provoke mass transport from the seed to the holder wall. The present inventors have overcome this difficulty and successful achieved seeded growth by establishing a reliable method for mounting a seed within the crucible so that the seed is nominally in full surface-to-surface contact with its holder. The present invention discloses techniques for mounting an AlN seed within a holder using nitride ceramics. These techniques help ensure that the only solid-gas interface around the seed is that chosen to effect the seeded growth.

Turning now to FIGS. 1A–1D, an embodiment of the present invention will be described in detail. A holder 10, fabricated from any material commonly used to fabricate crystal growth crucibles, is provided. Examples of suitable materials for holder 10 include BN (boron nitride), pBN (pyrolitic boron nitride), W (tungsten), Re (rhenium), graphite, Ta (tantalum), and TaN (tantalum nitride). As shown in FIG. 1A, an AlN seed 12 is placed within the holder 10, with a proximal end of seed 12 disposed at the bottom of the holder. Pellets 14 of a suitable support material are also provided. Pellets 14 may include nominally any material capable of forming a stable nitride ceramic by nitridation. Moreover, the suitable materials may exhibit vapor pressures within a relatively wide range, e.g., including vapor pressures below, at, or even above the vapor pressure of AlN at the furnace temperatures discussed below. In particular embodiments, the vapor pressure of the nitride ceramic is preferably less than or equal to about 110% that of the AlN. Examples of materials suitable for pellets 14 include aluminum, titanium, scandium, yttrium, or zirconium.

The holder, including seed 12, is placed in a conventional crystal sublimation furnace (not shown), within a nitrogen atmosphere. The furnace is then heated to a temperature greater than the melting point of the pellets 14, which temperature is generally sufficient to effect nitridation of the molten pellet material for a given nitrogen pressure. Then, as shown, pellets 14 are dropped into holder 10 over the seed. The pellets 14 are dropped at a rate sufficient to allow the pellets to completely melt and react with the nitrogen of the nitrogen atmosphere to form a dense nitride ceramic 16 as shown in FIG. 1B. Holder 10 thus effectively serves as a mold for the ceramic 16, with seed 12 molded in-situ with the ceramic. Formation of ceramic 16 in this manner provides a custom, form-fit with the seed 12, to nominally prevent the formation of any gaps or voids between the ceramic and the seed. This process is continued until the seed 12 is buried within the ceramic (FIG. 1C). The holder 10 is then cut at a location (e.g., orthogonally to the longitudinal axis a of the holder 10), sufficient to expose a distal surface 18 of seed 12, to form a completed seed mount 20 as shown in FIG. 1D.

The completed seed mount 20 may be placed within a crucible, such as that disclosed in the above-referenced U.S. patent application Ser. No. 10/324,998 (the '998 application), for seeded single crystal AlN growth from surface 18 of the seed. Advantageously, the tight, surface to surface engagement of the ceramic 16 with seed 12 provides relatively good thermal transfer between the seed and the relatively large mass of ceramic 16, to nominally prevent the occurrence of undesirable thermal gradients therebetween.

The approach of FIGS. 1A–1D may be advantageously used when the nitride ceramic 16 has a large vapor pressure relative to the AlN seed 12 under the pressure and temperature conditions characteristic of the particular seeded growth process. In particular, this embodiment enables the use of ceramics 16 having vapor pressures at the high end of the above-described range, e.g., up to about 100 to 110% that of AlN, since there are nominally no holes in holder 10 through which sublimated nitride may escape.

During AlN growth, holder 10 may be inverted relative to that shown in FIG. 1D, so that the colder region (i.e., seed 12 and ceramic 16) is disposed above the hotter region of the crucible. This orientation nominally prevents transport of material from the colder region even in the event the particular chosen ceramic 16 has a higher vapor pressure than the AlN seed.

Turning now to FIGS. 2A–2C, an alternate embodiment of the present invention is shown and described. These Figures correspond closely to those of FIGS. 1A–1C, with a difference being that holder 10' (e.g., FIG. 2A) is provided with an opening 22 sized and shaped to permit seed 12' to be inserted therethrough. This aspect advantageously exposes proximal surface 18' (FIG. 1A) of the seed, upon which growth may be initiated as will be discussed hereinbelow.

Such exposure of surface 18' eliminates the need for a final cutting step (such as described with respect to FIG. 1D above), for reduced scrap and potential labor and/or material cost savings.

As shown in FIG. 2A, holder 10' and seed 12' may be provided with their desired finished axial dimensions, since they do not require over-sizing to allow for subsequent cutting. Seed 12' may then be placed within holder 10' and hole 22, with proximal surface 18' exposed as shown. Pellets 14' of a suitable support material are also provided as discussed hereinabove with respect to FIGS. 1A–1D. Pellets 14' may include nominally any material capable of forming a stable nitride ceramic by nitridation. However, in this embodiment, pellets 14' are preferably fabricated from a material capable of forming a nitride which material has a lower vapor pressure than AlN under the AlN crystal growth conditions, as discussed in greater detail hereinbelow.

Holder 10', including seed 12' is placed in a conventional crystal sublimation furnace (not shown), within a nitrogen atmosphere. The furnace is then heated to a temperature greater than the melting point of the pellets 14', which temperature is generally sufficient to effect nitridation of the molten pellet material for a given nitrogen pressure. Then, as shown, pellets 14' are dropped into holder 10 over the seed.

As shown in FIG. 2B, pellets 14' are dropped at a rate sufficient to allow them to completely melt and react with the nitrogen of the nitrogen atmosphere to form a dense nitride ceramic 16' as shown in FIG. 2B. Formation of ceramic 16' in this manner effectively provides a custom, form-fit with the seed 12', which nominally prevents the formation of any gaps or voids between the ceramic and the seed. Ceramic 16' also fills in any clearance between hole 22 and seed 12'.

Turning now to FIG. 2C, ceramic formation is continued until the seed 12' is completely buried inside the ceramic 16', to form a completed seed mount 20'. The completed seed mount 20' may be placed within a crucible, such as that disclosed in the above-referenced '998 application, for seeded single crystal AlN growth from surface 18' of the seed.

Within the crucible, seed mount 20' is inverted 180 degrees relative to mount 20, to properly orient the surface 18'. For example, when using a crucible configured for a top-mounted seed, seed mount 20' may be oriented substantially as shown in FIG. 2C. In a similar crucible, seed mount 20 (FIG. 1D) would be inverted 180 degrees from the orientation shown.

The tight, surface to surface engagement of the ceramic 16' with seed 12' advantageously provides relatively good thermal transfer between the seed and the relatively large mass of the ceramic 16', to nominally prevent the occurrence of any deleterious thermal gradients therebetween.

Although both approaches described herein may be used to fabricate a seed mount suitable for single crystal AlN growth, as mentioned above, the latter approach of FIGS. 2A–2C may be particularly useful in the event the nitride ceramic 16' has a lower vapor pressure than the AlN seed 12' at the temperature and pressures used during the crystal growth process. This lower vapor pressure enables the seed to be secured within the ceramic 16' during crystal growth without the ceramic 16' undesirably sublimating and escaping through the hole 22 during the crystal growth process, and thus undesirably leaving the seed unsupported.

Moreover, although this latter approach (FIGS. 2A–2C) may be advantageously used with ceramics 16' of relatively low vapor pressures, ceramics having the relatively high vapor pressures (e.g., up to about 110% that of AlN) may also be used. In such an event, ceramic 16' may be provided with a sufficiently large size relative to seed 12' (FIG. 2C) to serve as an effective heat sink for exposed surface 18'. The heat sinking action of the ceramic 16' effectively maintains the temperature of exposed surface 18' low enough to render the vapor pressure (and any associated sublimation during AlN growth) inconsequential.

Moreover, although the embodiment of FIGS. 2A–2C is shown and described as forming a seed mount 20' in which seed 12' is entirely buried within ceramic 16' (FIG. 2C), the skilled artisan should recognize that the seed may be partially exposed, such as shown in FIG. 2B, and successfully used in seeded single crystal AlN growth, without departing from the spirit and scope of the present invention.

In the preceding specification, the invention has been described with reference to specific exemplary embodiments thereof. It will be evident that various modifications and changes may be made thereunto without departing from the broader spirit and scope of the invention as set forth in the claims that follow. The specification and drawings are accordingly to be regarded in an illustrative rather than restrictive sense.

Having thus described the invention, what is claimed is:

1. A method for fabricating a mount for an aluminum nitride (AlN) seed for single crystal aluminum nitride growth, the method comprising:
   (a) providing a holder having a proximal base and wall portions extending therefrom to define a cavity;
   (b) the holder being fabricated from a material selected from the group consisting of BN (boron nitride), pBN (pyrolitic boron nitride), W (tungsten), Re (rhenium), graphite, Ta (tantalum), TaN (tantalum nitride), and combinations thereof;

(c) disposing an AlN seed within the cavity of the holder;
(d) providing pellets fabricated from aluminum;
(e) placing the holder and seed within a nitrogen atmosphere at a temperature above the melting point of the pellets;
(f) dropping the aluminum pellets into the holder and onto the seed;
(g) permitting the pellets to melt and react with the nitrogen atmosphere to form a nitride ceramic, wherein the nitride ceramic is formed in conforming surface to surface engagement with the seed;
(h) repeating the dropping (f) and permitting (g) until the seed is substantially buried inside the ceramic; and
(i) cutting off a distal portion of the holder, ceramic, and seed, wherein the proximal end of the holder includes a proximal portion of the seed embedded within the ceramic, with the seed having an exposed crystal growth surface co-planar with a surface of the ceramic.

2. A method for fabricating a mount for an aluminum nitride (AlN) seed for single crystal aluminum nitride growth, the method comprising:
(a) providing a holder sized and shaped to receive an AlN seed therein, the holder fabricated from crystal growth crucible material;
(b) disposing an AlN seed within the holder; and
(c) encapsulating the AlN seed within the holder with at least one of the crystal growth crucible material and a ceramic wherein the only surface of the seed crystal that is exposed is a growth surface of the seed.

3. The method of claim 2, wherein said encapsulating (c) comprises:
(e) providing pellets of a material capable of forming a nitride ceramic by nitridation;
(f) placing the holder and seed within a nitrogen atmosphere at a temperature above the melting point of the pellets;
(g) dropping the pellets into the holder and onto the seed, and;
(h) permitting the pellets to melt and react with the nitrogen atmosphere to form a nitride ceramic, wherein the nitride ceramic is formed in conforming surface to surface engagement with the seed.

4. The method of claim 2, wherein said exposing (d) comprises removing a portion of the holder.

5. The method of claim 2, wherein the holder is fabricated from a material selected from the group consisting of BN (boron nitride), pBN (pyrolitic boron nitride), W (tungsten), Re (rhenium), graphite, Ta (tantalum), TaN (tantalum nitride), and combinations thereof.

6. The method of claim 2, wherein said disposing (b) comprises disposing a proximal end of the seed at a proximal end of the holder.

7. The method of claim 3, wherein said providing (e) comprises providing pellets of a material selected from the group consisting of: aluminum, titanium, yttrium, or scandium and combinations thereof.

8. The method of claim 6, further comprising providing a material capable of forming a ceramic nitride having a vapor pressure within a range of:
from less than that of AlN;
to about 110% that of AlN.

9. The method of claim 3, comprising repeating said dropping (g) and permitting (h) until the seed is completely buried within the ceramic.

10. A combination mount and aluminum nitride (AlN) seed for single crystal aluminum nitride growth, the combination comprising:
a holder fabricated from crystal growth crucible material;
a nitride ceramic disposed within the holder;
an AlN seed embedded in conforming surface to surface engagement within the nitride ceramic;
the nitride ceramic extending 360 degrees about the AlN seed in embedded engagement therewith;
the nitride ceramic disposed in conforming surface to surface engagement with the holder; and
a crystal growth surface of the AlN seed extending free of the nitride ceramic.

11. The combination of claim 10, wherein the AlN seed is molded in-situ within the nitride ceramic.

12. The combination of claim 10, wherein the crystal growth surface is parallel to a surface of the nitride ceramic.

13. The combination of claim 12, wherein the crystal growth surface is co-planar with a surface of the nitride ceramic.

14. The combination of claim 10, wherein a portion of the seed is exposed through an opening in the holder.

15. The combination of claim 14, wherein the crystal growth surface is disposed on the exposed portion of the seed.

16. The combination of claim 15, wherein the exposed portion of the seed extends through the opening.

17. The combination of claim 16, wherein the crystal growth surface is parallel with a surface of the holder.

18. The combination of claim 17, wherein the crystal growth surface is co-planar with the surface of the holder.

19. A method for effecting seeded single crystal aluminum nitride (AlN) growth, the method comprising:
(a) providing a holder having a proximal base and wall portions extending therefrom to define a cavity, the holder fabricated from crystal growth crucible material;
(b) disposing an AlN seed within the holder;
(c) providing pellets of a material capable of forming a nitride ceramic by nitridation;
(d) placing the holder and seed within a nitrogen atmosphere at a temperature above the melting point of the pellets;
(e) dropping the pellets into the holder and onto the seed;
(f) permitting the pellets to melt and react with the nitrogen atmosphere to form a nitride ceramic, wherein the nitride ceramic is formed in conforming surface to surface engagement with the seed;
(g) placing the holder with the ceramic and embedded seed, within a crystal growth enclosure containing Al and $N_2$ vapor;
(h) cooling an exposed surface of the seed relative to other locations in the crystal growth enclosure; and
(i) depositing the vapor under conditions capable of growing single crystalline AlN originating at the exposed surface.

20. A method for effecting seeded single crystal aluminum nitride (AlN) growth, the method comprising:
(a) providing a holder having a proximal base and wall portions extending therefrom to define a cavity;
(b) the holder being fabricated from a material selected from the group consisting of BN (boron nitride), pBN (pyrolitic boron nitride), W (tungsten), Re (rhenium), graphite, Ta (tantalum), TaN (tantalum nitride), and combinations thereof;
(c) disposing an AlN seed within the cavity of the holder;
(d) providing pellets fabricated from aluminum;

(e) placing the holder and seed within a nitrogen atmosphere at a temperature above the melting point of the pellets;
(f) dropping the aluminum pellets into the holder and onto the seed;
(g) permitting the pellets to melt and react with the nitrogen atmosphere to form a nitride ceramic, wherein the nitride ceramic is formed in conforming surface to surface engagement with the seed;
(h) repeating the dropping (f) and permitting (g) until the seed is substantially buried inside the ceramic;
(i) cutting off a distal portion of the holder, ceramic, and seed, wherein the proximal end of the holder includes a proximal portion of the seed embedded within the ceramic, with the seed having an exposed crystal growth surface co-planar with a surface of the ceramic;
(j) placing the holder with the ceramic and embedded seed, within a crystal growth enclosure containing Al and $N_2$ vapor;
(k) cooling the exposed crystal growth surface relative to other locations in the crystal growth enclosure; and
(l) depositing the vapor under conditions capable of growing single crystalline AlN originating at the crystal growth surface.

* * * * *